United States Patent
Lee

(10) Patent No.: US 7,947,540 B2
(45) Date of Patent: May 24, 2011

(54) MULTI-LEVEL SEMICONDUCTOR DEVICE AND METHOD OF FABRICATING THE SAME

(75) Inventor: Han-Sin Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1141 days.

(21) Appl. No.: 11/703,649

(22) Filed: Feb. 8, 2007

(65) Prior Publication Data
US 2007/0181882 A1    Aug. 9, 2007

(30) Foreign Application Priority Data

Feb. 9, 2006  (KR) .................. 10-2006-0012712

(51) Int. Cl.
*H01L 21/00* (2006.01)
*H01L 21/84* (2006.01)

(52) U.S. Cl. .................. 438/150; 257/E21.661
(58) Field of Classification Search .......... 257/758, 257/E27.111, E21.661; 438/150
See application file for complete search history.

(56) References Cited

U.S. PATENT DOCUMENTS

| | | | | |
|---|---|---|---|---|
| 4,489,478 A | * | 12/1984 | Sakurai | 438/18 |
| 4,902,637 A | * | 2/1990 | Kondou et al. | 438/152 |
| 5,470,776 A | * | 11/1995 | Ryou | 438/152 |
| 5,759,901 A | * | 6/1998 | Loh et al. | 438/305 |
| 5,834,341 A | * | 11/1998 | Chen | 438/152 |
| 5,847,428 A | * | 12/1998 | Fulford et al. | 257/344 |
| 6,268,630 B1 | * | 7/2001 | Schwank et al. | 257/347 |
| 2002/0119640 A1 | * | 8/2002 | Gonzalez | 438/455 |
| 2004/0262678 A1 | * | 12/2004 | Nakazawa et al. | 257/330 |
| 2005/0073051 A1 | | 4/2005 | Yamamoto et al. | |
| 2005/0151276 A1 | * | 7/2005 | Jang et al. | 257/903 |
| 2005/0179061 A1 | * | 8/2005 | Jang et al. | 257/208 |
| 2005/0221544 A1 | * | 10/2005 | Kwak et al. | 438/150 |
| 2006/0278985 A1 | * | 12/2006 | Lim et al. | 257/741 |

FOREIGN PATENT DOCUMENTS

| | | |
|---|---|---|
| JP | 06-061359 | 3/1994 |
| JP | 2005-101141 | 4/2005 |
| KR | 10-2005-0030097 | 3/2005 |

* cited by examiner

*Primary Examiner* — Kiesha R Bryant
*Assistant Examiner* — Igwe U Anya
(74) *Attorney, Agent, or Firm* — Lee & Morse, P.C.

(57) ABSTRACT

A multi-level semiconductor device includes a first transistor on a semiconductor substrate, the first transistor including a first source/drain region, a semiconductor layer on the semiconductor substrate, a second transistor on the semiconductor layer, the second transistor including a second source/drain region in a first portion of the semiconductor layer, and a contact pattern extending from the first source/drain region and contacting a second portion of the semiconductor layer, wherein the second portion of the semiconductor layer has an impurity concentration that is greater than that of the second source/drain region.

5 Claims, 5 Drawing Sheets

MULTI-LEVEL SEMICONDUCTOR DEVICE AND METHOD OF FABRICATING THE SAME

BACKGROUND OF THE INVENTION

1. Field of the Invention

The present invention relates to a semiconductor device and method of fabricating the same. More particularly, the present invention relates to a multi-level semiconductor device in which a plurality of transistors are stacked and method of fabricating the same.

2. Description of the Related Art

Conventionally, a semiconductor device may include transistors disposed on a bulk substrate to form circuits. However, the semiconductor device having transistors disposed on a bulk substrate has a limited integration density, and the integration density is further restricted because the device requires a structure for isolating the NMOS transistor and PMOS transistors that are formed on the same level.

Recently, a multi-level semiconductor device having a plurality of transistor layers on the semiconductor substrate has been investigated in order to solve latch-up problems and enhance integration density in the CMOS structure. Such a multi-level transistor structure may be employed in a SRAM cell having a high integration density and a CMOS structure.

A CMOS SRAM cell may use a PMOS transistor as load transistor. Two load transistors connected to Vcc and two drive transistors connected to Vss may form a latch. Two transfer transistors connected to respective bit lines and a word line WL may be connected to the latch. When the CMOS SRAM cell is formed on a bulk substrate, load transistors, which may be PMOS transistor, and drive transistors, which may be NMOS transistors, may be formed so close to each other that latch-up may occur. Thus the integration density may be limited in order to isolate PMOS transistors and NMOS transistors.

An SRAM cell could also be implemented as a multi-level transistor structure. However, in a multi-level structure, a transistor on an upper semiconductor layer may be connected to a contact pattern through a small contact area where the contact pattern meets a semiconductor layer. Due to a small contact area of the contact pattern with the semiconductor layer, resistance may be high. Further, in such a structure, increasing the drain region of a load transistor or forming a thick semiconductor layer in order to decrease resistance may result in increasing the leakage current. Also, if ions are injected into a node diffusion layer in a portion contacting the contact pattern, in order to decrease the contact resistance between the contact pattern and the node diffusion layer, resistance may increase due to decrease in concentration of the drain region of the load transistor having opposite conductivity.

SUMMARY OF THE INVENTION

The present invention is therefore directed to a multi-level semiconductor device and method of fabricating the same, which substantially overcome one or more of the problems due to the limitations and disadvantages of the related art.

It is therefore a feature of an embodiment of the present invention to provide a multi-level semiconductor device and method of fabricating the same wherein transistors formed on an upper layer exhibit good electrical characteristics.

It is therefore a feature of an embodiment of the present invention to provide a multi-level semiconductor device and method of fabricating the same wherein a contact resistance between a contact pattern and a source/drain region is reduced.

It is therefore another feature of an embodiment of the present invention to provide a multi-level semiconductor device and a method of fabricating the same wherein a contact pattern contacts a single crystalline layer in a lower interlayer dielectric.

At least one of the above and other features and advantages of the present invention may be realized by providing a multi-level semiconductor device, including a first transistor on a semiconductor substrate, the first transistor including a first source/drain region, a semiconductor layer on the semiconductor substrate, a second transistor on the semiconductor layer, the second transistor including a second source/drain region in a first portion of the semiconductor layer, and a contact pattern extending from the first source/drain region and contacting a second portion of the semiconductor layer, wherein the second portion of the semiconductor layer has an impurity concentration that is greater than that of the second source/drain region.

The second portion of the semiconductor layer may surround the contact pattern. The contact pattern may include a contact plug, and a barrier layer, wherein the barrier layer may be interposed between the contact plug and the semiconductor layer, and between the contact plug and the semiconductor substrate.

The device may be configured to provide a same electrical signal through the contact pattern to each of the first and second source/drain regions. The multi-level semiconductor device may further include a first interlayer dielectric covering the first transistor, the first interlayer dielectric may be between the semiconductor substrate and the semiconductor layer, and a second interlayer dielectric may cover the second transistor, wherein the contact pattern may extend from the first source/drain region through the first interlayer dielectric, the semiconductor layer, and the second interlayer dielectric in sequence. The contact pattern may include a contact plug, and a barrier layer, wherein the barrier layer may be between the contact plug and the first interlayer dielectric, between the contact plug and the second interlayer dielectric, between the contact plug and the semiconductor layer, and between the contact plug and the semiconductor substrate.

The contact pattern may contact a sidewall of the semiconductor layer and may partially overlap the semiconductor layer so as to be in contact with a top surface of the semiconductor layer. The multi-level semiconductor device may further include a single crystalline layer extending from the first source/drain region and contacting the semiconductor layer. The contact pattern may contact a sidewall of the single crystalline layer. The contact pattern may contact a sidewall of the single crystalline layer and the first source/drain region. The device may be configured to provide a same electrical signal through the contact pattern to each of the first and second source/drain regions.

The multi-level semiconductor device may further include a first interlayer dielectric covering the first transistor, the first interlayer dielectric being between the semiconductor substrate and the semiconductor layer, and a second interlayer dielectric covering the second transistor, wherein the single crystalline layer may extend through the first interlayer dielectric, and the contact pattern may extend through the first interlayer dielectric and the second interlayer dielectric. The contact pattern may contact a top surface and sidewall of the second source/drain region, a sidewall of the single crystalline layer, and the first source/drain region. The contact pattern may include a contact plug, and a barrier layer, wherein the barrier layer is interposed between the contact plug and the first interlayer dielectric, between the contact plug and the second interlayer dielectric, between the contact plug and the semiconductor substrate, and between the contact plug and the single crystalline layer.

At least one of the above and other features and advantages of the present invention may also be realized by providing a method of fabricating a multi-level semiconductor device, including forming a first transistor on a semiconductor substrate, the first transistor including a first source/drain region, forming a semiconductor layer on the semiconductor substrate, forming a second transistor on the semiconductor layer, the second transistor including a second source/drain region in a first portion of the semiconductor layer, doping impurities in a second portion of the semiconductor layer to form a contact region having a higher impurity concentration than the second source/drain region, and forming a contact pattern that extends from the first source/drain region and contacts the contact region of the semiconductor layer.

Forming the semiconductor layer may include forming a first interlayer dielectric on the semiconductor substrate, the first interlayer dielectric having a first contact hole that exposes a portion of the semiconductor substrate, and forming a single crystalline layer that extends from the semiconductor substrate within the first contact hole across the first interlayer dielectric. Forming the contact region may include forming an upper contact hole in an upper interlayer dielectric on the semiconductor layer, the upper contact hole exposing a portion of the semiconductor layer and partially overlapping a single crystalline layer in a lower interlayer dielectric, and doping the impurities in the semiconductor layer, and wherein forming the contact pattern may include removing a portion of the lower interlayer dielectric exposed by the upper contact hole, and forming a conductive layer in the upper and lower contact holes, the conductive layer contacting the single crystalline layer.

Forming the contact region may include forming a contact hole that exposes a portion of the semiconductor layer, and doping the impurities in the exposed portion of the semiconductor layer to form an impurities region that extends laterally in the semiconductor layer beyond the exposed portion of the semiconductor layer. Forming the contact pattern may include removing the exposed portion of the semiconductor layer to expose a sidewall of the laterally extending impurities region, and forming a conductive layer in the contact hole, the conductive layer contacting the sidewall of the impurities region. Forming the impurities region may include a thermal treatment to diffuse the impurities laterally in the semiconductor layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
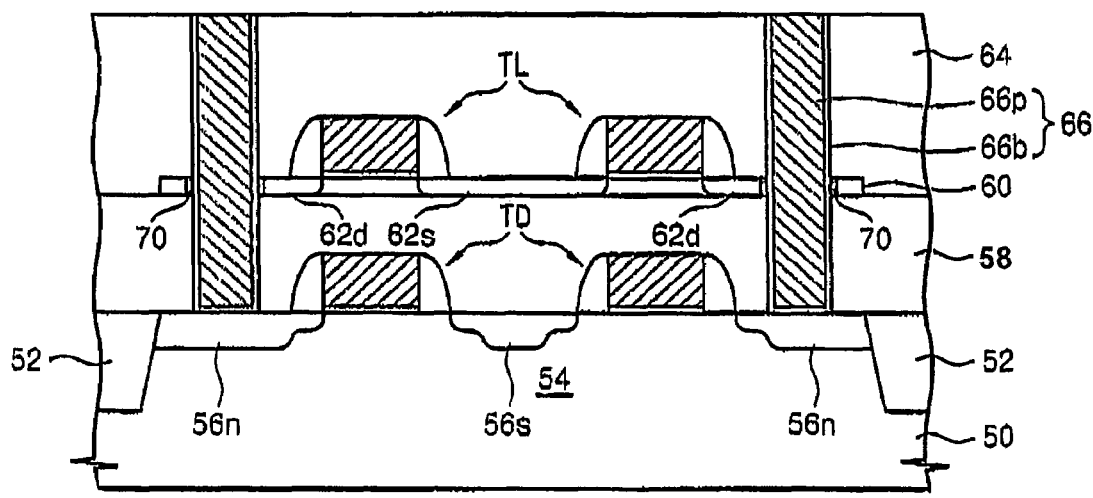
FIG. 1 illustrates a cross-sectional view of a multi-level semiconductor device according to a first embodiment of the present invention.

Korean Patent Application No. 2006-12712, filed Feb. 9, 2006, in the Korean Intellectual Property Office, and entitled: "Multi-Level Semiconductor Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a multi-level semiconductor device according to a first embodiment of the present invention.

Referring to FIG. 1, a device isolation layer 52 may be formed on a semiconductor substrate 50 to define an active region 54. A first transistor TD including first source/drain regions 56s and 56n may be formed in the active region 54. In the case of an SRAM, the first transistor may be a drive transistor, and the first source/drain region 56n may be a node diffusion layer. Although not shown in the drawings, a transfer transistor may be disposed in another region of the semiconductor substrate 50, and CMOS transistors constituting a peripheral circuit may also be formed.

A first interlayer dielectric 58 may cover the surface of the substrate where the first transistor TD is formed, and a semiconductor layer 60 may be formed on the first interlayer dielectric 58. A second transistor TL including the second source/drain regions 62s and 62d may be formed on the semiconductor layer 60. The second transistor may have a channel with a different conductivity type from a channel of the first transistor TD.

A second interlayer dielectric 64 may be formed on the surface of the substrate where the first interlayer dielectric 58 and the second transistor TL are formed. A contact pattern 66 may penetrate the first interlayer dielectric 58 and the second interlayer dielectric 64.

The contact pattern 66 may extend from the semiconductor substrate 50 to penetrate the semiconductor layer 60, and may electrically connect the first source/drain region 56n of the first transistor TD with the second source/drain region 62d of the second transistor TL. In the case of a SRAM cell, the connections of the contact pattern 66 to the first transistor TD and the second transistor TL may correspond to connections to two nodes of a latch, to which a load transistor and a drive transistor are connected, respectively.

The contact pattern 66 may be formed in a contact hole 65a penetrating the first interlayer dielectric 58 and the second interlayer dielectric 64. The contact pattern 66 may include a barrier layer, e.g., a barrier metal layer 66b, formed conformally on the sidewalls and bottom of a contact hole 65a, as well as a conductive plug 66p filling the contact hole 65a having the barrier metal layer 66b. A relatively heavily doped contact region 70 may be formed at a portion of the semiconductor layer 60 that is in contact with the contact pattern 66. A concentration of impurities doped in the contact region 70 may be higher than that of the second source/drain region 62d.

Although not shown in the drawings, the semiconductor substrate 50 adjacent to the barrier metal layer 66b and the semiconductor layer 60 may be metal-silicided to form an ohmic layer. Also, another semiconductor layer may be formed on the second interlayer dielectric 58 to form a third transistor. The third transistor may be electrically connected with the first transistor, the second transistor or a transistor in another region according to the configuration of circuit. In this case also, the semiconductor layer 60 may have a relatively heavily doped contact region 70 at a portion contacting the contact pattern 66.

FIGS. 2 to 7 illustrate cross-sectional views of stages in a method of fabricating a multi-level semiconductor device according to the first embodiment of the present invention.

Figure 2:
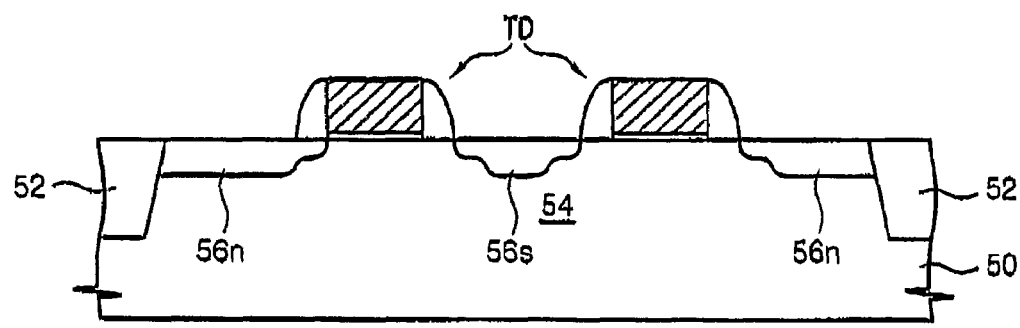
FIGS. 2 to 7 illustrate cross-sectional views of stages in a method of fabricating a multi-level semiconductor device according to the first embodiment of the present invention.

Referring to FIG. 2, the device isolation layer 52 may be formed on a semiconductor substrate 50 to define the active region 54. A gate pattern may be formed in the active region 54, and impurities may be injected into the active regions at opposite sides adjacent to a gate pattern to form first source/drain regions 56s and 56n. This structure may be the first transistor TD on the semiconductor substrate 50. In the case of a SRAM cell, the first transistor TD may be a drive transistor, e.g., an N-channel transistor. A transfer transistor may be formed on another region of the substrate, so as to be connected to the node diffusion layer 56n among the first source/drain regions.

Figure 3:
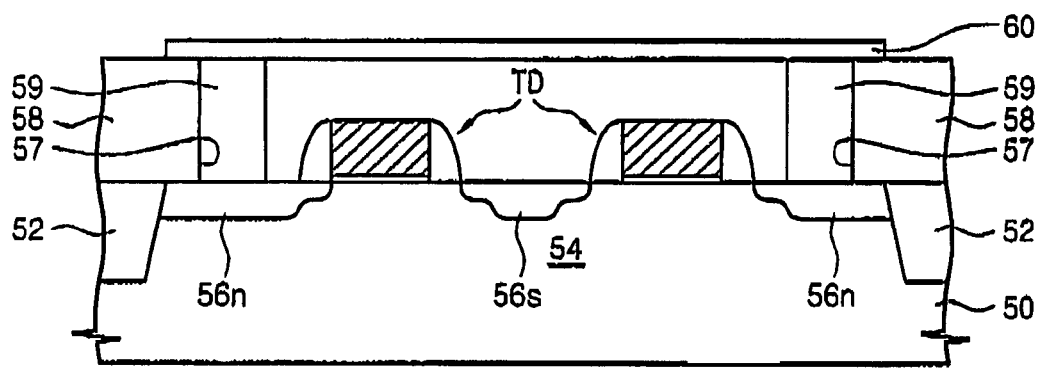
Figure 4:
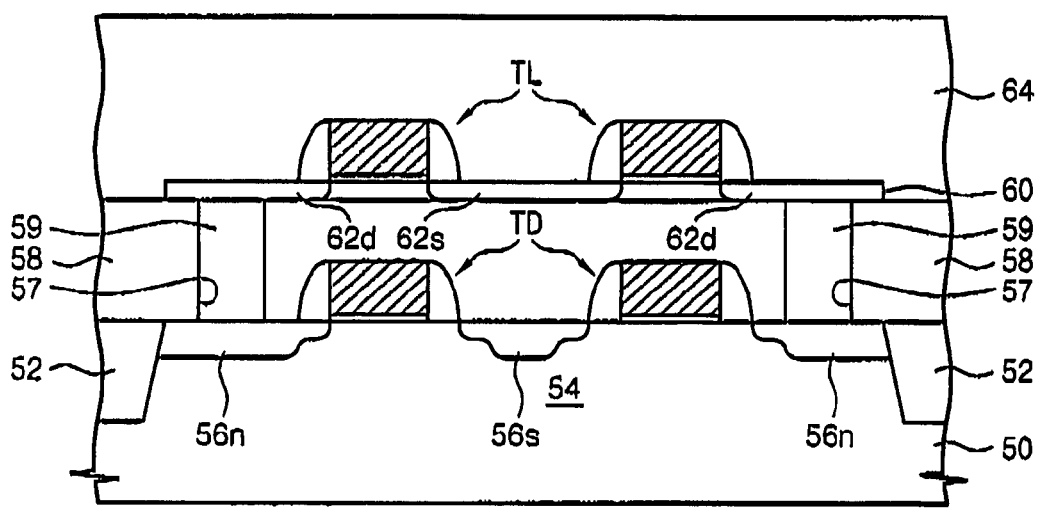

Referring to FIG. 3, the first interlayer dielectric 58 may be formed on the surface of the substrate 50 where the first transistor TD is formed. The first interlayer dielectric 58 may be patterned to form a first contact hole 57 that exposes the semiconductor substrate 50. A single crystalline layer, e.g., an epitaxial layer 59, may be grown from the semiconductor substrate 50 exposed by the first contact hole 57.

By continuing to grow the epitaxial layer 59 while infusing the first contact hole 57, the epitaxial layer 59 may be expanded laterally across the surface of the first interlayer dielectric 58 as well as vertically from the first interlayer dielectric 58. The epitaxial layer 59 grown while infusing the first contact hole 57 in the first interlayer dielectric 58 may extend to cover the top part of the first interlayer dielectric 58. The epitaxial layer 59 may be planarized and patterned to form a predetermined shape of the semiconductor layer 60.

Alternatively, amorphous silicon or a polysilicon layer may be formed on the first interlayer dielectric 58. The amorphous silicon or polysilicon layer may be changed into a single crystalline silicon layer by employing, e.g., solid-phase epitaxial growth, thereby forming the semiconductor layer 60. The process may use a solid-phase epitaxial growth process with annealing, and/or a laser may be irradiated to change the amorphous silicon or polysilicon layer into a single-crystalline silicon layer. In this case, a process of forming the first contact hole 57 and/or the epitaxial growth process may not be required.

Figure 5:
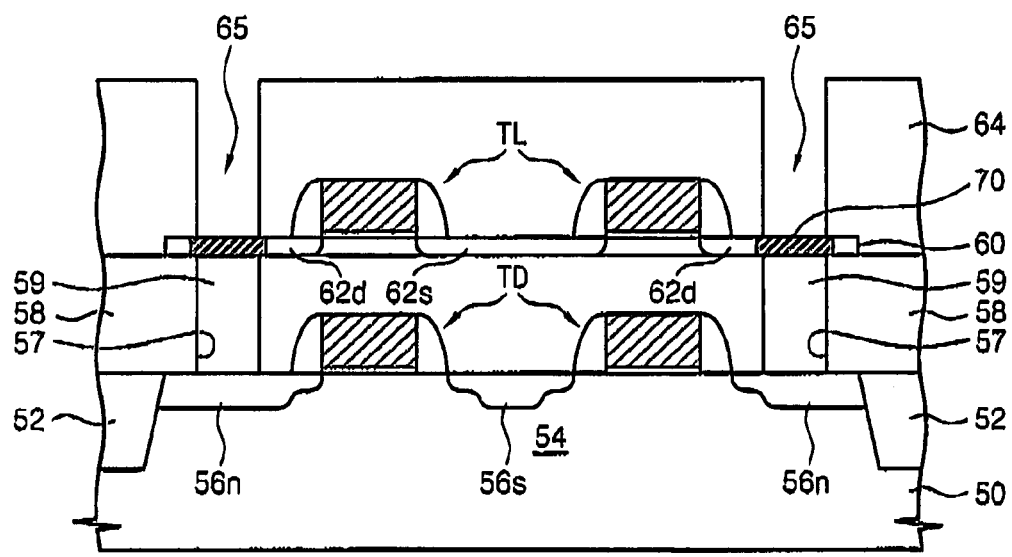

Referring to FIG. 5, the second transistor TL having gate electrodes and second source/drain regions 62s and 62d may be formed on the semiconductor layer 60. The second interlayer dielectric 64 may be formed on the surface of the substrate where the second transistor TL is formed. The second transistor TL may be, e.g., a P-channel transistor. Since the second transistor TL may be on the semiconductor layer 60 while the first transistor TD may be on the semiconductor substrate 50, the multi-level semiconductor device according to the first embodiment of the present invention may avoid the latch-up problem associated with the conventional approach wherein an N-channel transistor and a P-channel transistor are formed on a same plane in a narrow region. Accordingly, a multi-level semiconductor device according to the first embodiment of the present invention may provide an increased integration density as compared to a device having N-channel and P-channel transistors formed on a same plane.

Referring to FIG. 5, the second interlayer dielectric 64 may be patterned to form a second contact hole 65 exposing the semiconductor layer 60. According to the first embodiment of the present invention, the second contact hole 65 may be formed on the first contact hole 57. The second contact hole 65 may expose the semiconductor layer 60 on which the second source/drain 62d is formed.

Impurities may be doped or injected into the semiconductor layer 60 exposed by the second contact hole 65 so as to form a region having a relatively high concentration of impurities, indicated by impurities layer 70, as compared to the level of impurities in the second source/drain regions 62s and 62d. The impurities injected to form the impurities layer 70 may be of the same type used for the source/drain region 62d.

After forming the impurities layer 70, the injected impurities may be diffused by thermal treatment. The impurities layer 70 may be diffused laterally to a predetermined width in the semiconductor 60 so as to extend to be proximate to the second contact hole 65. The impurities layer 70 may extend around the entire circumference of the area exposed by the second contact hole 65. Thus, the contact pattern 66 formed in the contact hole 65a, as described below, may make contact with the impurities layer 70 around the entire circumference of the contact hole 65a.

Figure 6:
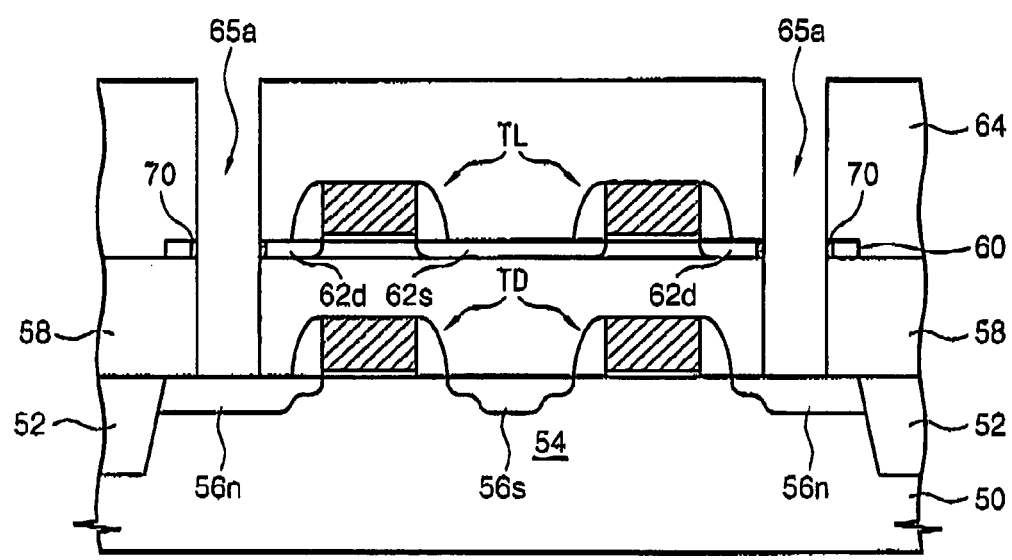

Referring to FIG. 6, the semiconductor substrate 50 may be exposed by successively removing the portion of the semiconductor layer 60 that is exposed in the second contact hole 65, and by removing the epitaxial layer 59 in the first contact hole 57. Thus, the first interlayer dielectric 58, the second interlayer dielectric 64, and the semiconductor layer 60 may be penetrated to form a continuous contact hole 65a. The sidewall part of impurities layer 70 may be exposed.

Figure 7:
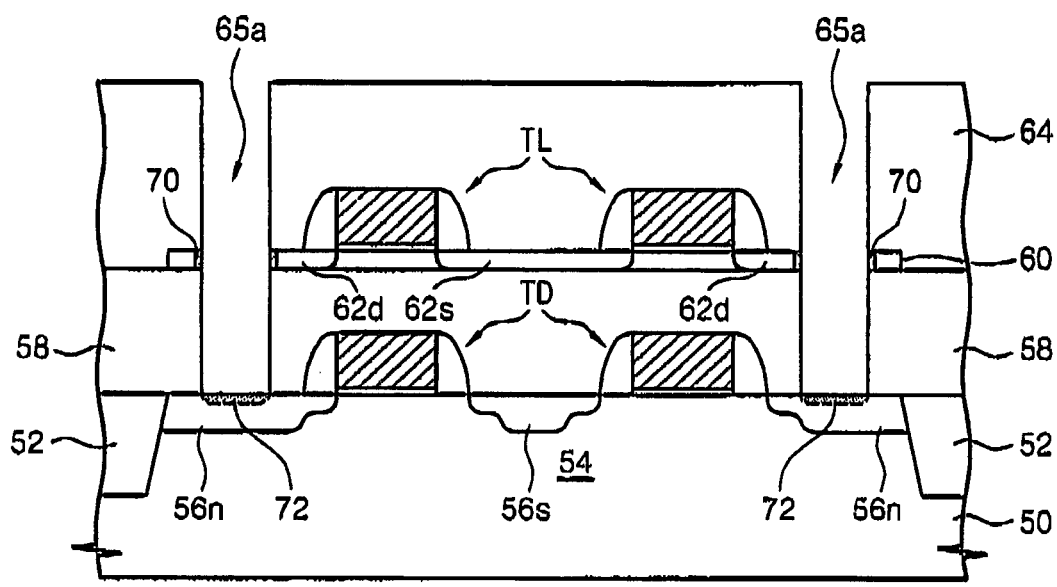

Referring to FIG. 7, a plug ion injected layer 72 may be further formed at the first source/drain region 56n by injecting ions into the semiconductor substrate 50 exposed in the contact hole 65a. The injected ions may be, e.g., N-type impurities. The second source/drain region 62d may be a P-type impurity layer, and the exposed sidewall of the more heavily doped region of the semiconductor layer 60, i.e., the exposed sidewall of the impurities layer 70, that is exposed in the contact hole 65a may have a high concentration of impurities.

Continuing with FIG. 7, the contact pattern 66 may be formed by, e.g., conformally forming the barrier metal layer 66b within the contact hole 65a, and filling the contact hole 65a with the conductive plug 66p (see FIG. 1) within the barrier metal layer 66b. The barrier metal layer 66b may include one or more of titanium, titanium nitride, cobalt nickel, etc. The conductive plug 66p may include one or more of aluminum, copper, tungsten, etc.

According to an exemplary embodiment of the present invention, by forming a contact region in a more-concentrated impurities layer 70 on the sidewall of the semiconductor layer 60 adjacent to the contact pattern 66, resistance may be decreased without increasing the thickness of the semiconductor layer 60 and without generally increase of concentration of impurities in the second source/drain region 62d.

Figure 8:
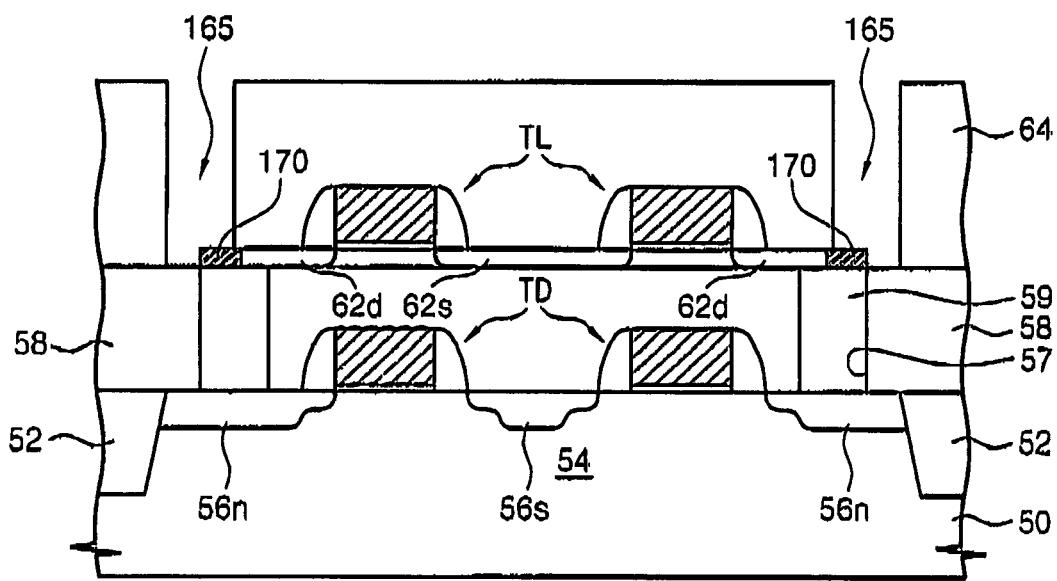
FIGS. 8 and 9 illustrate cross-sectional views of stages in a method of fabricating a multi-level semiconductor device according to a second embodiment of the present invention.
Figure 9:
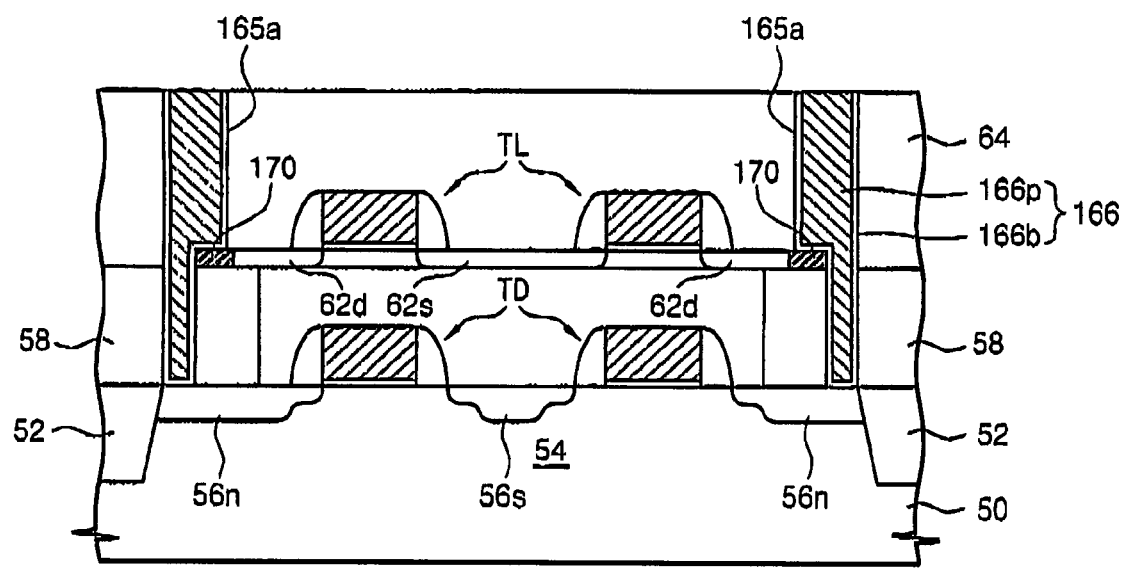

FIGS. 8 and 9 illustrate cross-sectional views of stages in a method of fabricating a multi-level semiconductor device according to another embodiment of the present invention.

Referring to FIG. 8, a second contact hole 165 may expose a portion of the semiconductor layer 60 and a portion of the first interlayer dielectric 58. The second contact hole 165 may be offset by a predetermined amount with respect to the first contact hole 57. As shown, the area of semiconductor layer 60 exposed by the second contact hole 165 may be increased by offsetting the edge of the semiconductor layer 60, the second contact hole 165 and the first contact hole 57 with respect to one another. The semiconductor layer 60 may partially or completely cover the first contact hole 57 such that a single crystalline layer therein, e.g., the epitaxial layer 59, may contact an underside of the semiconductor layer 60 across part or all of the first contact hole 57. All or part of the portion of the semiconductor layer 60 that interfaces with the epitaxial layer 59 may be a relatively highly concentrated impurities layer 170.

The impurities layer 170 may be formed in a portion of the semiconductor layer 60 that is exposed in the second contact hole 165 in similar fashion to the formation of the impurities layer 70 described above, e.g., by doping the semiconductor layer 60 exposed in the second contact hole 165, thermally treating the doped semiconductor layer 60, etc.

Referring to FIG. 9, by removing a portion of the first interlayer dielectric 58 that is exposed by the second contact hole 165, the sidewall of the epitaxial layer 59 within the first contact hole 58 may be exposed. Thus, the contact hole 165a exposing the semiconductor substrate 50 may be formed.

Continuing with FIG. 9, a contact pattern 166 may be formed in the contact hole 165a. The contact pattern 166 may include a barrier layer, e.g., a barrier metal layer 166b, and a conductive plug 166p. According to the second embodiment of the present invention, a contact resistance may be reduced due to contact between the contact pattern 166 and a part of the top surface, as well as a sidewall of, the epitaxial layer 59. The contact with the sidewall of the epitaxial layer 59 may reduce resistance even where the contact region with the semiconductor layer 60 may be small.

As disclosed above, a contact pattern that electrically connects a transistor on a semiconductor substrate to a transistor on an overlying semiconductor layer may be formed, and resistance of a contact region between the contact pattern and the semiconductor layer may be decreased by forming a more highly-concentrated impurities region in the semiconductor layer adjacent the contact pattern. By increasing the impurities doping concentration rate in only the portion of the semiconductor layer that is adjacent to the contact pattern, an increase of leakage current may be minimized without changing the doping density in the source/drain region. Thus, electrical characteristics of the device and the transistors may be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a multi-level semiconductor device, comprising:
    forming a first transistor on a semiconductor substrate, the first transistor including a first source/drain region;
    forming a semiconductor layer on the semiconductor substrate;
    forming a second transistor on the semiconductor layer, the second transistor including a second source/drain region in a first portion of the semiconductor layer;
    doping impurities in a second portion of the semiconductor layer to form a contact region having a higher impurity concentration than the second source/drain region; and
    forming a contact pattern that extends from the first source/drain region and contacts the contact region of the semiconductor layer,
    wherein forming the contact region includes:
        forming an upper contact hole in an upper interlayer dielectric on the semiconductor layer, the upper contact hole exposing a portion of the semiconductor layer and partially overlapping a single crystalline layer in a lower interlayer dielectric; and
        doping the impurities in the semiconductor layer,
    and wherein forming the contact pattern includes:
        removing a portion of the lower interlayer dielectric exposed by the upper contact hole to form a lower contact hole; and
        forming a conductive layer in the upper and lower contact holes, the conductive layer contacting the single crystalline layer.

2. The method as claimed in claim 1, wherein forming the semiconductor layer comprises:
    forming the lower interlayer dielectric on the semiconductor substrate, the lower interlayer dielectric having a first contact hole that exposes a portion of the semiconductor substrate; and
    forming the single crystalline layer that extends from the semiconductor substrate within the first contact hole across the first interlayer dielectric.

3. The method as claimed in claim 1, wherein
    doping the impurities in the second portion of the semiconductor layer forms an impurities region that extends laterally in the semiconductor layer beyond the exposed portion of the semiconductor layer.

4. The method as claimed in claim 3, wherein forming the contact pattern includes removing a portion of the exposed portion of the semiconductor layer to expose a sidewall of the impurities region such that the conductive layer contacts the sidewall of the impurities region.

5. The method as claimed in claim 3, wherein forming the impurities region includes a thermal treatment to diffuse the impurities laterally in the semiconductor layer.

* * * * *